US005783341A

United States Patent [19]

Uzawa

[11] Patent Number: 5,783,341
[45] Date of Patent: Jul. 21, 1998

[54] ALIGNMENT FOR LAYER FORMATION THROUGH DETERMINATION OF TARGET VALUES FOR TRANSLATION, ROTATION AND MAGNIFICATION

[75] Inventor: Shigeyuki Uzawa, Tokyo, Japan

[73] Assignee: Canon Kabushiki Kaisha, Japan

[21] Appl. No.: 950,904

[22] Filed: Oct. 15, 1997

Related U.S. Application Data

[63] Continuation of Ser. No. 445,717, May 22, 1995, abandoned.

[30] Foreign Application Priority Data

May 25, 1994 [JP] Japan .................................. 6-111021

[51] Int. Cl.$^6$ ........................................................ G03F 9/00
[52] U.S. Cl. .................................................. 430/22; 430/30
[58] Field of Search ............................. 438/975; 430/30; 356/399

[56] References Cited

U.S. PATENT DOCUMENTS

| | | | |
|---|---|---|---|
| 5,142,156 | 8/1992 | Ozawa et al. | 250/548 |
| 5,150,391 | 9/1992 | Ebinuma et al. | 378/34 |
| 5,155,523 | 10/1992 | Hara et al. | 355/53 |
| 5,182,615 | 1/1993 | Kurosawa et al. | 356/400 |
| 5,468,580 | 11/1995 | Tanaka | 430/5 |

*Primary Examiner*—Christopher G. Young
*Attorney, Agent, or Firm*—Fitzpatrick, Cella, Harper & Scinto

[57] ABSTRACT

An aligning method for aligning a layer to be formed on a substrate with layers which have been formed on the substrate includes the steps of measuring the positions of marks formed on each of at least two layers which have been formed on the substrate, and determining the positions of the layer to be formed on the substrate based on results of the measurement of the positions of the marks. The invention also relates to a method for manufacturing devices including the steps of coating a resist on a wafer on which a plurality of layers are laminated, transferring a pattern on a mask onto the resist on the surface of the wafer, developing the resist on the wafer to form a layer of the pattern on the surface of the wafer, measuring the positions of marks formed on each of at least two layers from among the plurality of layers, and aligning the wafer with the mask based on the results of the measurement.

9 Claims, 8 Drawing Sheets

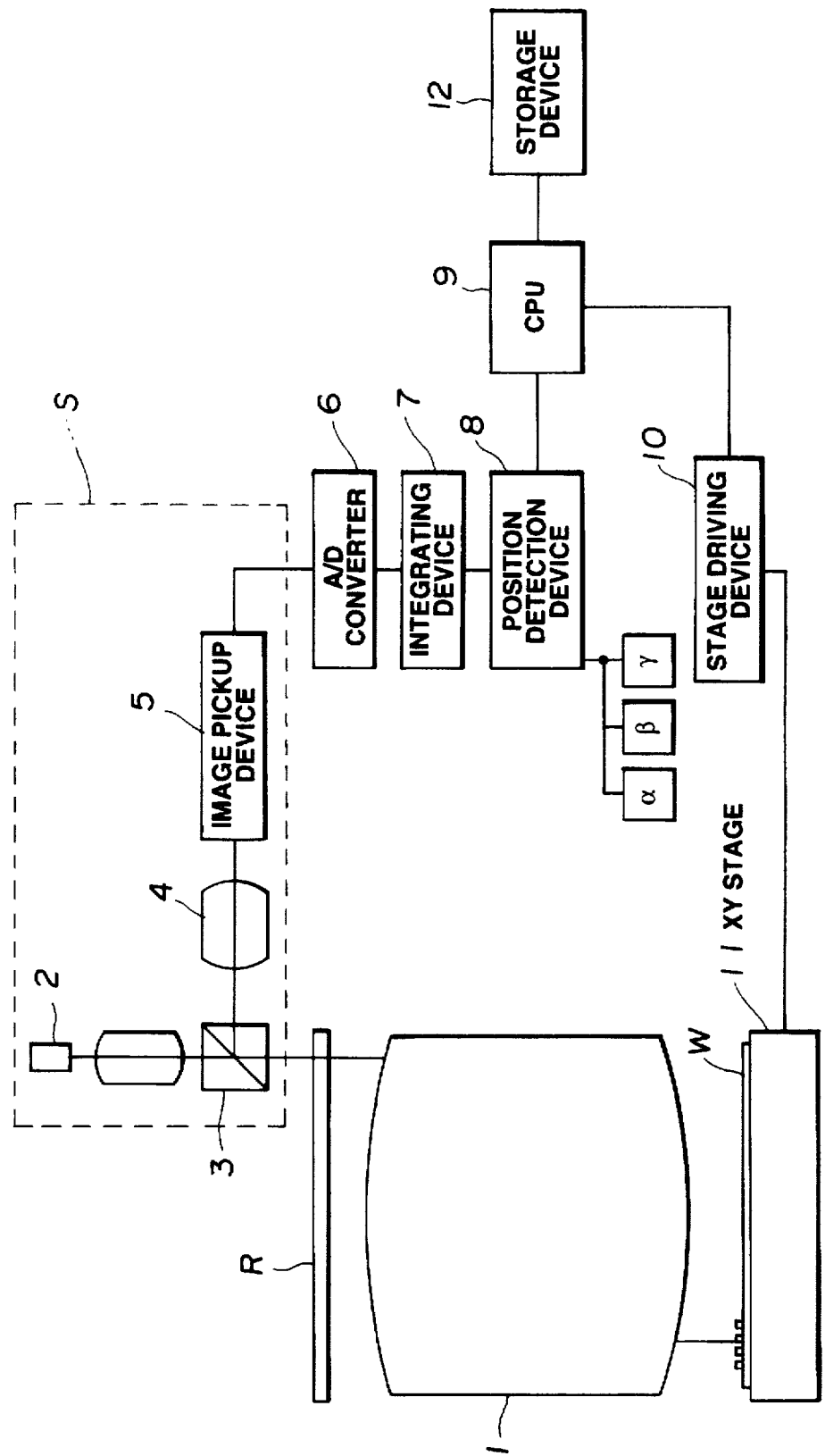

5,783,341

ALIGNMENT FOR LAYER FORMATION THROUGH DETERMINATION OF TARGET VALUES FOR TRANSLATION, ROTATION AND MAGNIFICATION

This application is continuation of application Ser. No. 08/445,717 filed May 22, 1995, now abandoned.

BACKGROUND OF THE INVENTION

1. Field of the Invention

This invention relates to an aligning method, and a method for manufacturing semiconductor devices using the aligning method.

2. Description of the Related Art

Semiconductor devices are usually manufactured by sequentially forming about 10–30 films on a substrate. Each of the films formed on the substrate is called a layer. The pattern of each layer must be formed at predetermined horizontal positions on the substrate. Accordingly, when forming a certain layer on the substrate, alignment marks which have been formed on a preceding layer are measured, and positions of the certain layer are determined in accordance with the measured values of the alignment marks.

Conventionally, alignment marks are formed on a layer for which highest alignment accuracy is required, and subsequent layers are formed by performing exposure after measuring the positions of the alignment marks. A method has also been proposed in which a process for forming alignment marks is performed before forming layers for manufacturing semiconductor devices, and all subsequent layers are aligned with the alignment marks formed in this process.

In actual semiconductor-device manufacture, in order to determine the position of a certain layer, the positional relationship with a plurality of layers is important as well as the positional relationship with a specific layer. For example, when forming an insulating layer (a layer C), the insulating layer must be aligned with each of a conductive layer (a layer B) under the layer C and a layer to be insulated (a layer A) under the layer B within a predetermined tolerance. If a deviation greater than the tolerance is produced relative to one of the layers A and B, the production yield in the semiconductor-device manufacture is greatly influenced.

Conventionally, alignment marks are formed in the layer A, and the layers B and C are formed by being aligned with the alignment marks. At that time, the positional relationship between the layers B and C is determined via the layer A. If the alignment error between the layers A and C is represented by $\epsilon_a$ and the alignment error between the layers A and B is represented by $\epsilon_b$, the alignment error between the layers B and C is $(\epsilon_a^2 + \epsilon_b^2)^{1/2}$. In this approach, even if the tolerance in relative positions between the layers C and A has the same value as that between the layers C and B, the production yield is determined by the alignment accuracy between the layers C and B which has a greater value.

SUMMARY OF THE INVENTION

The present invention has been made in consideration of the above-described problems.

It is an object of the present invention to increase the production yield in semiconductor-device manufacture by aligning a layer with a plurality of other layers with a good balance.

According to one aspect, the present invention, which achieves the above-described object, relates to an aligning method for aligning a layer to be formed on a substrate with layers which have been formed on the substrate, comprising the steps of measuring positions of marks formed on each of at least two layers which have been formed on the substrate, and determining the positions of the layer to be formed on the substrate based on the results of the measurement of the positions of the marks.

In one embodiment, the determining step further comprises the step of performing a weighted averaging operation of the results of the measurement using weights corresponding to required accuracy values in alignment between the layer and the respective layers which have been formed on the substrate.

According to another aspect, the present invention relates to a method for aligning a wafer on which a plurality of layers are laminated and a mask, comprising the steps of measuring the positions of marks formed on each of at least two layers from among the plurality of layers, and aligning the wafer with the mask based on the results of the measurement.

In one embodiment, the aligning step further comprises the step of performing a weighted averaging operation of the results of the measurement using weights corresponding to required accuracy values in alignment between the respective layers having the marks and the mask.

According to still another aspect, the present invention relates to a method for manufacturing devices by coating a resist on a wafer on which a plurality of layers are laminated, transferring a pattern on a mask onto the resist on the surface of the wafer, and developing the resist on the wafer to form a layer of the pattern on the surface of the wafer, comprising the steps of measuring the positions of marks formed on each of at least two layers from among the plurality of layers, and aligning the wafer with the mask based on the results of the measurement.

In one embodiment, the aligning step further comprises the step of performing a weighted averaging operation of the results of the measurement using weights corresponding to required accuracy values in alignment between the respective layers having the marks and the layer having the pattern.

The foregoing and other objects, advantages and features of the present invention will become more apparent from the following description of the preferred embodiments taken in conjunction with the accompanying drawings.

BRIEF DESCRIPTION OF THE DRAWINGS

FIG. 1 is a diagram illustrating an alignment apparatus according to an embodiment of the present invention;

DESCRIPTION OF THE PREFERRED EMBODIMENTS

Figure 2A:
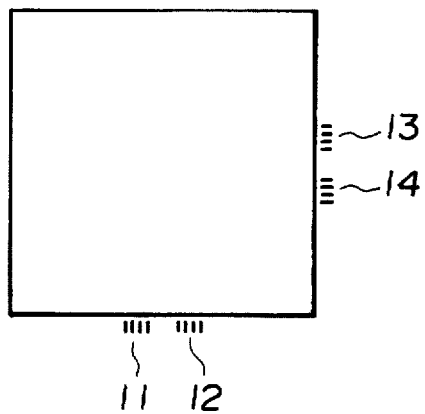
FIGS. 2(a) and 2(b) are diagrams illustrating the arrangement of alignment marks in the embodiment.

FIG. 1 illustrates an alignment apparatus according to an embodiment of the present invention. In FIG. 1, there are shown a reticle R, a wafer W, a projection exposure lens 1, and an alignment optical system S. The alignment optical system S includes an illuminating device 2 for alignment, a beam splitter 3, an alignment scope 4, and an image pickup device 5.

A light beam from the illuminating device 2 for alignment illuminates marks on the wafer W via the beam splitter 3 and the projection exposure lens 1, and the images of the marks are imaged onto the image pickup device 5 via the projection exposure lens 1, the beam splitter 3 and the alignment scope 4. An A/D converter 6 converts an image signal from the image pickup device 5 into a digital signal. The digital signal is integrated by an integrating device 7, and the positions of the marks are detected by a position detection device 8 according to a template matching method. The position detection device 8, which has templates $\alpha$, $\beta$ and $\gamma$, can switch processing in accordance with the kind of marks at a high speed. Information relating to the measurement of the positions of the respective marks is subjected to statistical processing by a CPU (central processing unit) 9, which transmits an instruction to a stage driving device 10.

Figure 2B:
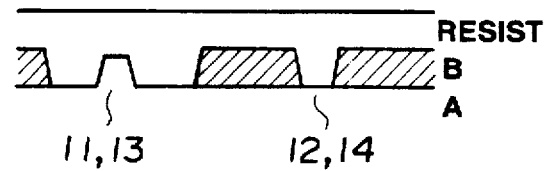

FIGS. 2(a) and 2(b) illustrate the arrangement of marks in the present embodiment: FIG. 2(a) is a plan view illustrating, the arrangement of marks within a shot; and FIG. 2(b) illustrates the structure of steps of the marks. In FIGS. 2(a) and 2(b), reference numerals 11 and 13 represent alignment marks formed on a layer A, and reference numerals 12 and 14 represent alignment marks formed on a layer B.

Figure 3:
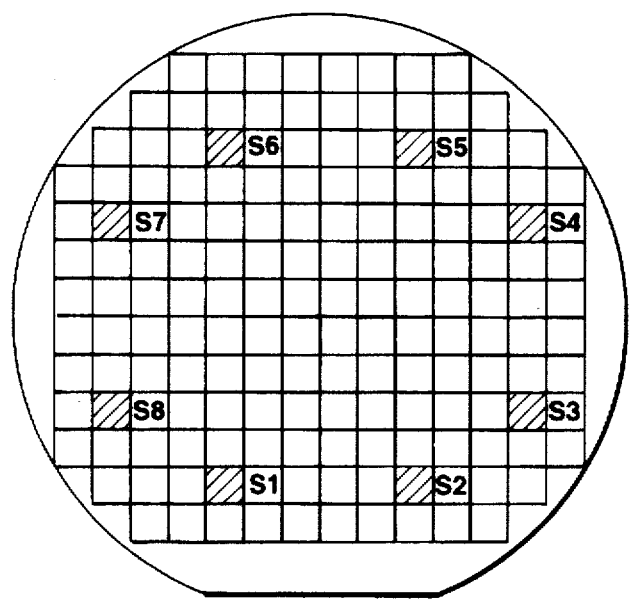
FIG. 3 is a diagram illustrating an example of the arrangement of measurement shots in a global alignment operation in the embodiment.
Figure 4:
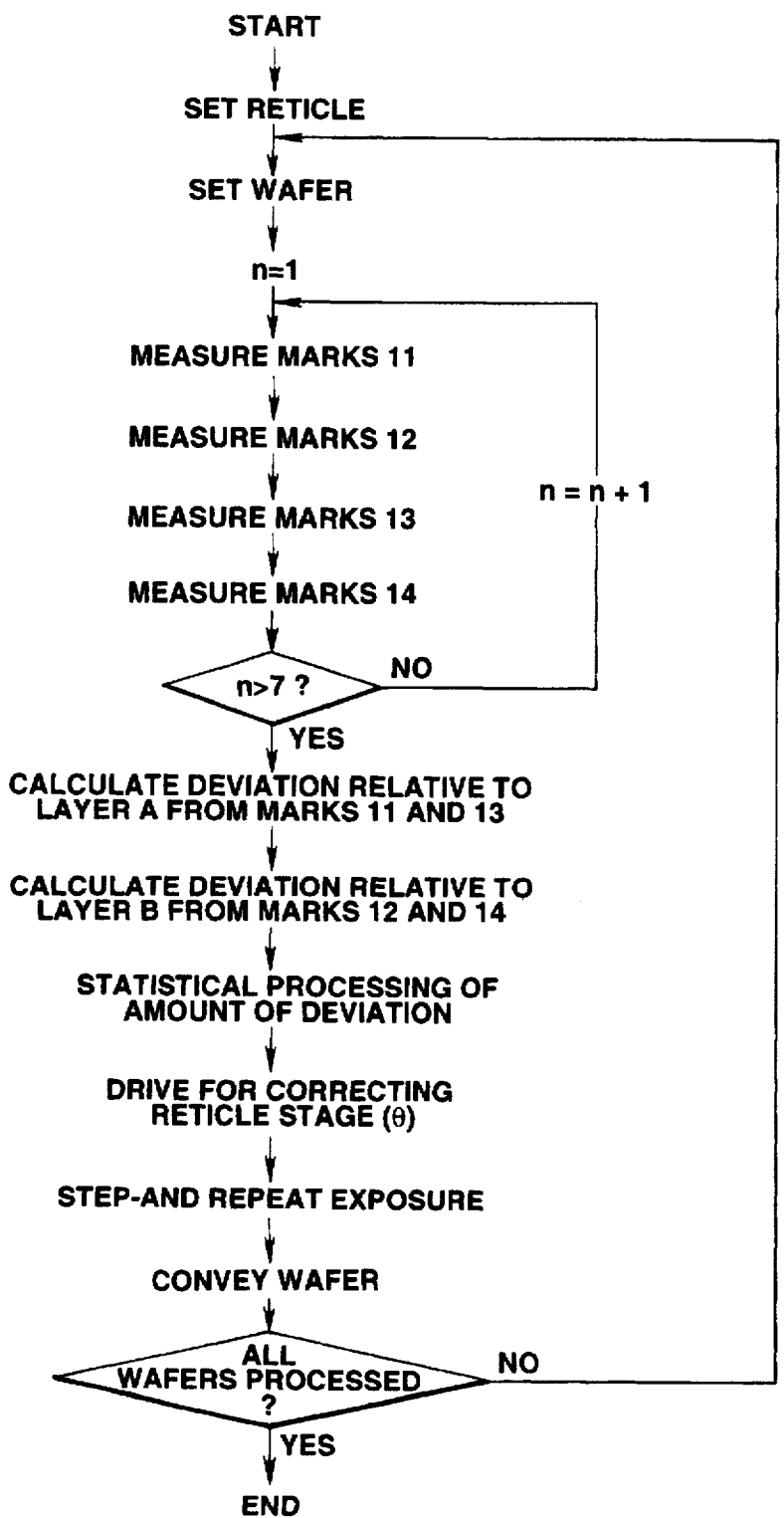
FIG. 4 is a flowchart illustrating a measurement/exposure sequence in the embodiment.

FIG. 3 illustrates an example of arrangement of measurement shots in a global alignment operation. FIG. 4 illustrates a measurement/exposure sequence for the case shown in FIG. 3. In the global alignment operation, only the positions of sampled shots are measured. Hence, the ratio of the time period required for the measurement to the time period required for the entire wafer processing is small. Accordingly, even when the measurement time per shot is substantially doubled because marks on the layers A and B are detected as in the present embodiment, the influence of this procedure on the entire throughput is small. In general, when performing position measurement according to the template matching method, it is necessary to change the template in accordance with the structure of the steps of the alignment marks. In the present embodiment, a plurality of templates are used, and are switched at a high speed.

If the position and the measurement error of a shot obtained from the position measurement of the alignment marks on the layer A are represented by a and $\epsilon_a$, respectively, and the position and the measurement error of the shot obtained from the position measurement of the alignment marks on the layer B are represented by b and $\epsilon_b$, respectively, the target position c of the shot for forming the layer C at that time is calculated according to the following expression:

$$c = \tfrac{1}{2}(a+b).$$

The alignment error $E_{b-c}$ between the layers B and C is expressed as:

$$E_{b-c} = (\tfrac{1}{2}(\epsilon_a^2 + \epsilon_a^2 + \epsilon_b^2))^{1/2} \leq (\epsilon_a^2 + \epsilon_b^2)^{1/2}.$$

Hence, the alignment error becomes smaller than when measuring only the alignment marks on the layer B. In the above-described expression, it is assumed that the measurement error $\epsilon_a$ of the alignment marks on the layer A has the same value when the layer B is formed and when the layer B is not formed.

Different values of required alignment accuracy between respective layers are determined when designing a semiconductor device. If the values of required alignment accuracy between the layers C and A, and between the layers C and B are represented by $C_a$ and $C_b$, respectively, the target position c of a shot for forming the layer C is calculated according to the following expression:

$$c = M_a/(M_a+M_b) \times a + M_b/(M_a+M_b) \times b \tag{1}$$

where $M_a = 1/(C_a - \epsilon_a)$, and $M_b = 1/(C_b - \epsilon_b)$.

This expression is applicable to two layers to be aligned with another layer. A similar expression can be obtained when the number of layers to be aligned with another layer equals at least three.

Figure 5:
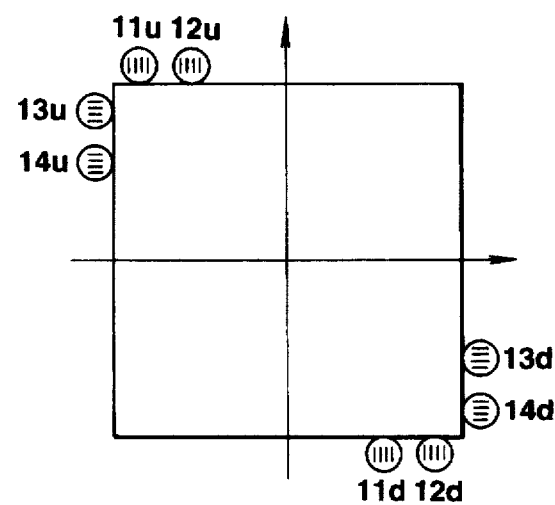
FIG. 5 is a diagram illustrating the arrangement of marks for chip rotation and chip magnification.
Figure 6:
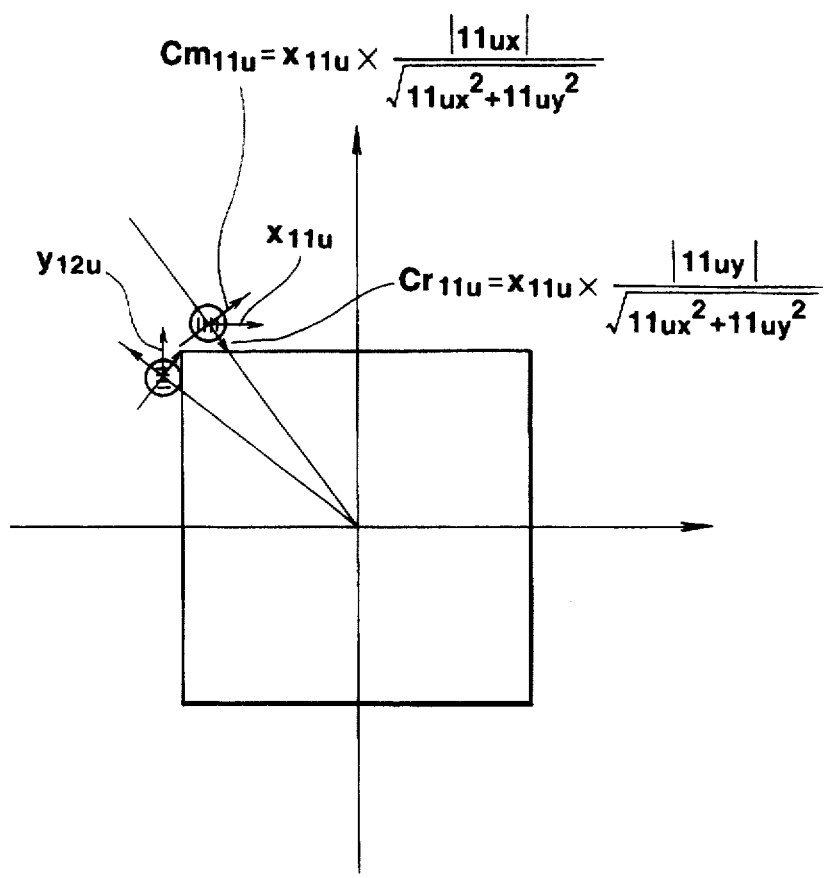
FIG. 6 is a diagram illustrating the calculation of chip rotation and chip magnification.

Also in the case of alignment by measuring the rotation and the magnification of a chip, target values can be calculated according to expressions which are similar to expression (1). FIGS. 5 and 6 illustrate such a case. As shown in FIG. 5, if four kinds of marks are provided for one measurement shot, the rotation and the magnification of a chip can be obtained as well as translational components of the chip. If the measured value and the position of each mark are determined as shown in Table 1, an error $R_A$ in the rotation of the chip relative to the layer A, and an error $R_B$ in the rotation of the chip relative to the layer B are obtained according to a calculation method illustrated in FIG. 6, and an amount of correction R for the rotation of the chip can be determined from the mean value of the $R_A$ and $R_B$. A similar calculation can also be performed for the magnification M of the chip. By performing fine adjustment of the exposure magnification, alignment can be performed over the entire chip region. Expressions for calculating correction amounts are as follows:

TABLE 1

Values of Marks

| Mark Number | Measured Value | X Coordinate of Mark | Y Coordinate |
|---|---|---|---|
| 11d | $x_{11d}$ | $11_{dx}$ | $11_{dy}$ |
| 12d | $x_{12d}$ | $12_{dx}$ | $12_{dy}$ |
| 13d | $y_{13d}$ | $13_{dx}$ | $13_{dy}$ |
| 14d | $y_{14d}$ | $14_{dx}$ | $14_{dy}$ |
| 11u | $x_{11u}$ | $11_{ux}$ | $11_{uy}$ |
| 12u | $x_{12u}$ | $12_{ux}$ | $12_{uy}$ |
| 13u | $y_{13u}$ | $13_{ux}$ | $13_{uy}$ |
| 14u | $y_{14u}$ | $14_{ux}$ | $14_{uy}$ |

$R = (R_A + R_B)$
$R_A = (11_{ux}/(11_{ux}^2 + 11_{uy}^2))x_{11u} +$
$\quad (13_{uy}/(13_{ux}^2 + 13_{uy}^2))y_{13u} +$
$\quad (11_{dx}/(11_{dx}^2 + 11_{dy}^2))x_{11d} +$
$\quad (13_{dy}/(13_{dx}^2 + 13_{dy}^2))y_{13d}$
$R_B = (12_{ux}/(12_{ux}^2 + 12_{uy}^2))x_{12u} +$
$\quad (14_{uy}/(14_{ux}^2 + 14_{uy}^2))y_{14u} +$
$\quad (12_{dx}/(12_{dx}^2 + 12_{dy}^2))x_{12d} +$
$\quad (14_{dy}/(14_{dx}^2 + 14_{dy}^2))y_{14d}$
$M = (M_A + M_B)$
$M_A = (11_{uy}/(11_{ux}^2 + 11_{uy}^2))x_{11u} +$
$\quad (13_{ux}/(13_{ux}^2 + 13_{uy}^2))y_{13u} +$
$\quad (11_{dy}/(11_{dx}^2 + 11_{dy}^2))x_{11d} +$
$\quad (13_{dx}/(13_{dx}^2 + 13_{dy}^2))y_{13d}$
$M_B = (12_{uy}/(12_{ux}^2 + 12_{uy}^2))x_{12u} +$
$\quad (14_{ux}/(14_{ux}^2 + 14_{uy}^2))y_{14u} +$
$\quad (12_{dy}/(12_{dx}^2 + 12_{dy}^2))x_{12d} +$
$\quad (14_{dx}/(14_{dx}^2 + 14_{dy}^2))y_{14d}.$ Next, a description will be provided of a semiconductor-device manufacturing method utilizing the above-described aligning method.

Figure 7:
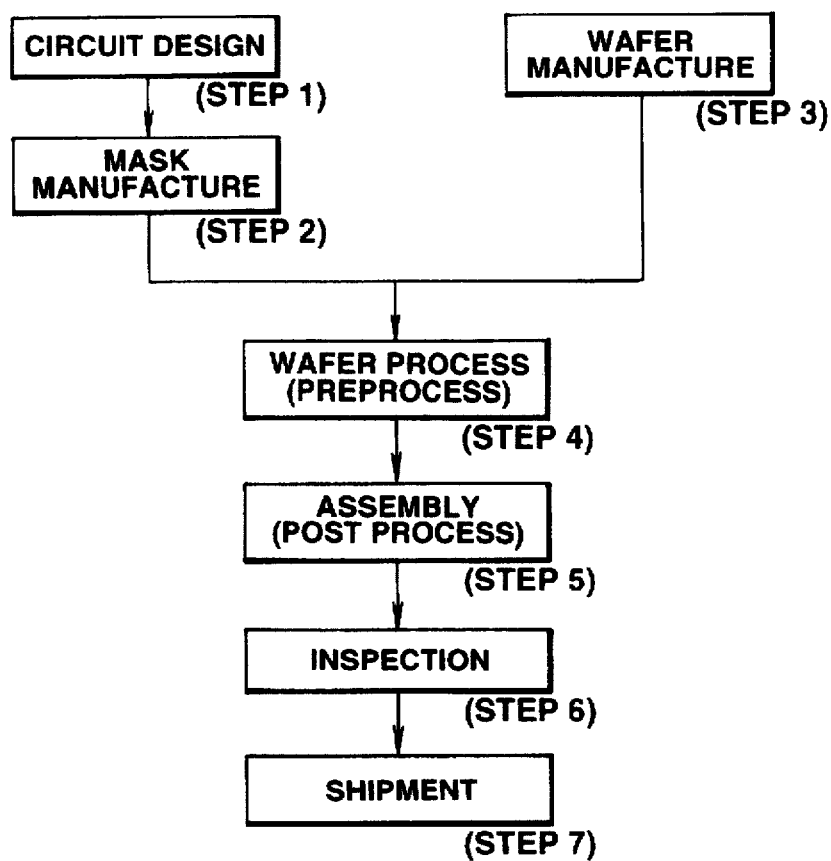
FIG. 7 is a flowchart for the manufacture of semiconductor devices according to the present invention.

FIG. 7 is a flowchart for the manufacture of semiconductor devices (semiconductor chips of IC's (integrated circuits), LSI's (large-scale integrated circuits) or the like), liquid-crystal panels, CCD's (charge-coupled devices), or the like).

In step 1 (circuit design), circuit design of semiconductor devices is performed. In step 2 (mask manufacture), masks on which designed circuit patterns are formed are manufactured. In step 3 (wafer manufacture), wafers are manufactured using a material, such as silicon or the like. Step 4 (wafer process) is called a preprocess, in which actual circuits are formed on the wafers by means of photolithography using the above-described masks and wafers. The next step 5 (assembly) is called a postprocess, which manufactures semiconductor chips using the wafers manufactured in step 4, and includes an assembling process (dicing and bonding), a packaging process (chip encapsulation), and the like. In step 6, inspection operations such as operation-confirming tests, durability tests, and the like of the semiconductor devices manufactured in step 5, are performed. The manufacture of semiconductor devices is completed after passing through the above-described processes, and the manufactured devices are shipped (step 7).

Figure 8:
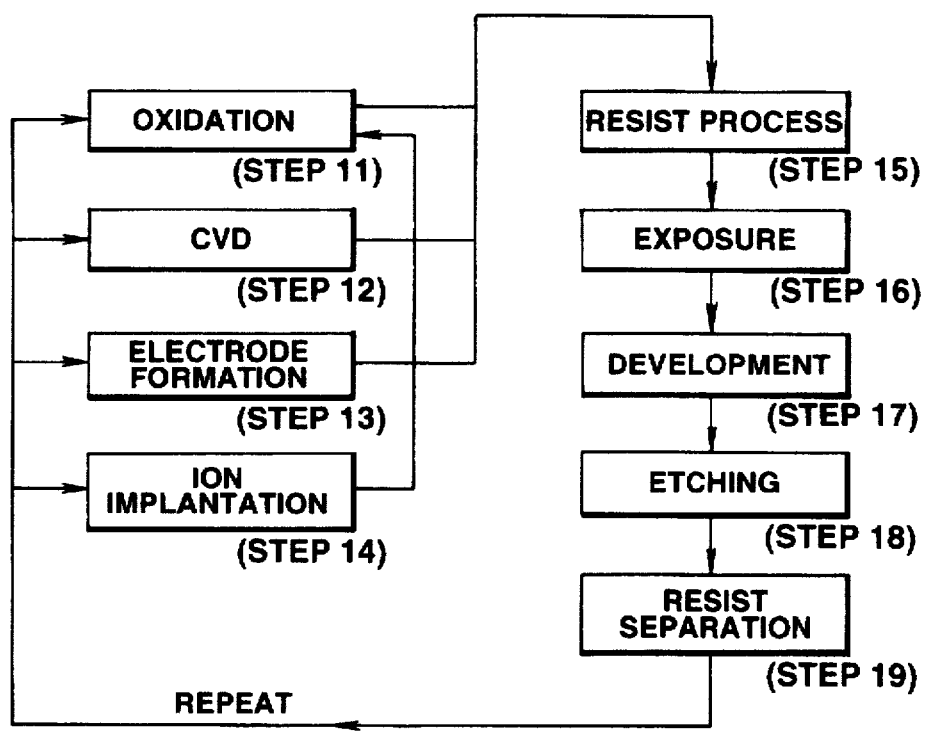
FIG. 8 is the detailed flowchart of the wafer process shown in FIG. 7.

FIG. 8 is the detailed flowchart of the above-described wafer process shown in step 4 of FIG. 7. First, in step 11 (oxidation), the surface of the wafer is oxidized. In step 12 (CVD), an insulating film is formed on the surface of the wafer. In step 13 (electrode formation), electrodes are formed on the surface of the wafer by vacuum deposition. In step 14 (ion implantation), ions are implanted into the wafer. In step 15 (resist process), a photosensitive material is coated on the wafer. In step 16 (exposure), the circuit pattern on the mask is exposed and printed on the wafer after performing alignment according to the above-described aligning method. In step 17 (development), the exposed wafer is developed. In step 18 (etching), portions other than the developed image are etched off. In step 19 (resist separation), the resist, which becomes unnecessary after the completion of the etching, is removed. By repeating these steps, a final circuit pattern made of multiple patterns is formed on the wafer.

By using the manufacturing method of the present embodiment, it is possible to easily manufacture semiconductor devices with a high degree of integration which have previously been difficult to manufacture.

The individual components designated by blocks in the drawings are all well known in the aligning method and semiconductor-device manufacturing method arts and their specific construction and operation are not critical to the operation or the best mode for carrying out the invention.

The invention may be embodied in other specific forms without departing from the spirit or essential characteristics thereof. The present embodiment is therefore to be considered in all aspects as illustrative and not restrictive, the scope of the invention being indicated by the appended claims rather than by the foregoing description and all changes which come within the meaning and range of equivalency of the claims are therefore intended to be embraced therein.

What is claimed is:

1. A method for determining target values for the translation, rotation, and magnification of a layer to be formed on a substrate with layers which have been formed on the substrate, said method comprising the steps of:

measuring the positions of marks formed on each of at least two layers which have been formed on the substrate;

determining translation, rotation, and magnification errors of the layer to be formed on the substrate with respect to the at least two layers based on the positions measured in said measuring step: and determining target values for the translation, rotation, and magnification of the layer to be formed on the substrate based on the determined translation, rotation, and magnification errors.

2. A method according to claim 1, wherein the layers comprise an A layer, a B layer, and a C layer, wherein the position of the layer C to be formed on the substrate is denoted by c, the position of layer A is denoted by a, the position of layer B is denoted by b, the values of required alignment accuracy between layers C and A, and between layers C and B are denoted by Ca and Cb, respectively, the alignment error between layers A and C is denoted by $e_a$, and the alignment error between layers A and B is denoted by $e_b$, and wherein said determining step determines position c according to the following equation:

$$c = Ma/(Ma+Mb) \times a + Mb/(Ma+Mb) \times b,$$

where $Ma = 1/(Ca-e_a)$, and $Mb = 1/(Cb-e_b)$.

3. A method for aligning a wafer on which a plurality of layers are laminated with a mask, said method comprising the steps of:

measuring the positions of marks formed on each of at least two layers from among the plurality of layers;

determining translation, rotation, and magnification errors of a pattern on the mask to be formed on the wafer with respect to the at least two layers based on the positions measured in said measuring step:

determining target values for the translation, rotation, and magnification of the pattern to be formed on the wafer based on the determined errors: and aligning the wafer with the mask based on the determined target values.

4. A method according to claim 3, wherein the layers comprise an A layer, a B layer, and a C layer, wherein the position of the layer C, to be formed on the substrate is denoted by c, the position of layer A is denoted by a, the position of layer B is denoted by b, the values of required alignment accuracy between layers C and A, and between layers C and B are denoted by Ca and Cb, respectively, the alignment error between layers A and C is denoted by $e_a$, and the alignment error between layers A and B is denoted by $e_b$, and wherein said aligning step determines position c according to the following equation:

$$c = Ma/(Ma+Mb) \times a + Mb/(Ma+Mb) \times b,$$

where $Ma = 1/(Ca-e_a)$ and $Mb = 1/(Cb-e_b)$.

5. A method for manufacturing devices comprising the steps of:

coating a resist on a wafer on which a plurality of layers are laminated, wherein marks are formed on each of at least two of the plurality of layers;

measuring the positions of marks formed on each of the at least two layers from among the plurality of layers;

determining translation, rotation, and magnification errors of a pattern of a mask to be formed on the wafer with respect to the at least two layers based on the measured positions:

determining target values for the translation, rotation, and magnification of the pattern of the mask to be formed on the wafer based on the determined translation, rotation, and magnification errors;

aligning the wafer with the mask based on the determined target values transferring the pattern on a mask onto the resist on the surface of the wafer by forming an image of the pattern on the surface of the wafer; and developing the resist on the wafer to form a layer on the surface of the wafer.

6. A method according to claim 5, wherein the layers comprise an A layer, a B layer and a C layer, wherein the position of the layer C, to be formed on the substrate in said transferring and developing steps is denoted by c, the position of layer A is denoted by a, the position of layer B is denoted by b, the values of required alignment accuracy between layers C and A, and between layers C and B are denoted by Ca and Cb, respectively, the alignment error between layers A and C is denoted by $\epsilon a$, and the alignment error between layers A and B is denoted by $\epsilon b$, and wherein said aligning step determines position c according to the following equation:

$$c = Ma/(Ma+Mb) \times a + Mb/(Ma+Mb) \times b,$$

where

Ma=1/(Ca−$\epsilon$a) and Mb=1/(Cb−$\epsilon$b).

7. A method for determining target values for the translation, rotation, and magnification of a layer C, to be formed on a substrate, with layers A and B which have been formed on the substrate, wherein the translation error between layers A and C is denoted by $\epsilon_a$ and the translation error between layers A and B is denoted by $\epsilon_b$, said method comprising the steps of:

measuring the positions of marks formed on each of layers A and B which have been formed on the substrate;

determining rotation and magnification errors of the layer C to be formed on the substrate with respect to layers A and B based on the measured positions;

determining the translation error $E_{b-c}$ between layers B and C according to the equation:

$$E_{b-c} = (\frac{1}{2}(\epsilon^2_a + \epsilon^2_a + \epsilon^2_b))^{1/2};$$

and determining target values for the translation, rotation, and magnification of the layer C to be formed on the substrate based on the determined translation, rotation, and magnification errors.

8. A method for aligning a wafer on which a plurality of layers A and B, are laminated with a mask and on which a layer C will formed with the mask, wherein the translation error between layers A and C and between layers A and B are denoted by $\epsilon_a$ and $\epsilon_b$, respectively, said method comprising the steps of:

measuring the positions of marks formed on each of layers A and B;

determining rotation and magnification errors of the layer C to be formed on the substrate with respect to layers A and B based on the measured positions;

determining the translation error $E_{b-c}$, between layers B and C according to the equation:

$$E_{b-c} = (\frac{1}{2}(\epsilon^2_a + \epsilon^2_a + \epsilon^2_b))^{1/2};$$

determining target values for the translation, rotation, and magnification of the layer C to be formed on the wafer based on the determined translation, rotation, and magnification errors; and aligning the wafer with the mask based on the results of the determined target values.

9. A method for manufacturing devices comprising the steps of:

coating a resist on a wafer on which a plurality of layers A and B, are laminated and on which a layer C will be formed, wherein the translation error between layers A and C and between layers A and B are denoted by $\epsilon_a$ and $\epsilon_b$, respectively, measuring the positions of marks formed on each of layers A and B;

determining rotation and magnification errors of the layer C to be formed on the wafer with respect to layers A and B based on the measured positions:

determining the translation error $E_{b-c}$ between layers B and C according to the equation:

$$E_{b-c} = (\frac{1}{2}(\epsilon^2_a + \epsilon^2_a + \epsilon^2_b))^{1/2};$$

determining target values for the translation, rotation, and magnification of the layer C to be formed on the wafer based on the determined translation, rotation, and magnification errors:

aligning the wafer with the mask based on the determined target values;

transferring a pattern on a mask onto the resist on the surface of the wafer by forming an image of the pattern on the surface of the wafer; and developing the resist on the wafer to form the layer C on the surface of the wafer.

* * * * *

UNITED STATES PATENT AND TRADEMARK OFFICE
CERTIFICATE OF CORRECTION

PATENT NO. : 5,783,341

DATED : July 21, 1998

INVENTOR(S) : SHIGEYUKI UZAWA

It is certified that error appears in the above-identified patent and that said Letters Patent is hereby corrected as shown below:

ON THE COVER PAGE:

At [73] Assignee:

"Japan" should read --Tokyo, Japan--.

COLUMN 3:

Line 24, "illustrating," should read --illustrating--.

COLUMN 5:

Line 5, "like)." should read --like.--.
    Line 17, "operations" should read --operations,--.

COLUMN 6:

Line 14, "ea," should read --ea,--.
    Line 31, "step:" should read --step;--.
    Line 34, "errors:" should read --errors;-- and "aligning" should begin a new paragraph.

COLUMN 7:

Line 2, "values" should read --values;--.
    Line 50, "will" should read --will be--.

UNITED STATES PATENT AND TRADEMARK OFFICE
CERTIFICATE OF CORRECTION

PATENT NO. : 5,783,341

DATED : July 21, 1998

INVENTOR(S) : SHIGEYUKI UZAWA

It is certified that error appears in the above-identified patent and that said Letters Patent is hereby corrected as shown below:

COLUMN 8:

```
    Line 32, "positions:" should read --positions;--.
    Line 41, "errors:" should read --errors;--.
```

Signed and Sealed this

Twenty-ninth Day of June, 1999

Attest:

Q. TODD DICKINSON

*Attesting Officer*　　　*Acting Commissioner of Patents and Trademarks*